United States Patent [19]
Chien

[11] Patent Number: 5,926,440
[45] Date of Patent: Jul. 20, 1999

[54] ELECTRO-LUMINESCENT NIGHT LIGHT AND TIME PIECE

[76] Inventor: Tseng-Lu Chien, 8P, No. 29, Alley 73, Lin-Shen Road, Shi-Chi Town, Taipel, Hseng, Taiwan

[21] Appl. No.: 08/923,988

[22] Filed: Sep. 5, 1997

Related U.S. Application Data

[63] Continuation-in-part of application No. 08/910,202, Aug. 13, 1997, which is a continuation-in-part of application No. 08/383,404, Feb. 3, 1995, Pat. No. 5,667,394.

[51] Int. Cl.$^6$ ........................... G04B 47/00; H01R 33/00; F21V 33/00
[52] U.S. Cl. ............................... 368/10; 368/67; 362/226; 362/253
[58] Field of Search .................. 368/10, 67, 82, 368/84, 227; 362/226, 253, 84

[56] References Cited

U.S. PATENT DOCUMENTS

| | | |
|---|---|---|
| 2,972,125 | 2/1961 | Temple et al. . |
| 3,329,851 | 7/1967 | Braeutogam et al. . |
| 3,430,088 | 2/1969 | Beswick . |
| 4,208,869 | 6/1980 | Hanaoka ................................. 368/84 |
| 4,253,170 | 2/1981 | Meisner .................................. 368/67 |
| 5,247,492 | 9/1993 | Pan ........................................ 368/79 |
| 5,465,198 | 11/1995 | Kellogg .................................. 362/253 |
| 5,469,342 | 11/1995 | Chien . |
| 5,524,101 | 6/1996 | Thorgersen ............................ 368/10 |
| 5,572,817 | 11/1996 | Chien . |
| 5,599,088 | 2/1997 | Chien . |
| 5,601,358 | 2/1997 | Chien . |
| 5,611,621 | 3/1997 | Chien . |
| 5,638,339 | 6/1997 | De Loretto ............................. 368/10 |
| 5,662,208 | 9/1997 | Marischen ............................. 362/226 |
| 5,662,408 | 9/1997 | Marischen . |
| 5,667,394 | 9/1997 | Chien . |
| 5,667,736 | 9/1997 | Chien . |
| 5,683,164 | 11/1997 | Chien . |
| 5,688,038 | 11/1997 | Chien . |
| 5,704,705 | 1/1998 | Chien . |
| 5,720,651 | 2/1998 | Chien . |
| 5,722,757 | 3/1998 | Chien . |
| 5,722,760 | 3/1998 | Chien . |
| 5,746,501 | 5/1998 | Chien . |
| 5,752,337 | 5/1998 | Chien . |
| 5,754,064 | 5/1998 | Chien . |

*Primary Examiner*—Vit Miska
*Attorney, Agent, or Firm*—Bacon & Thomas

[57] ABSTRACT

A night light is combined with a time piece, the night light including an electro-luminescent panel which illuminates a display of the time piece. The time piece may be separable from the night light so that either could be separately used, and/or an optical effects device or member may be added to project an image of the illuminated display.

17 Claims, 3 Drawing Sheets

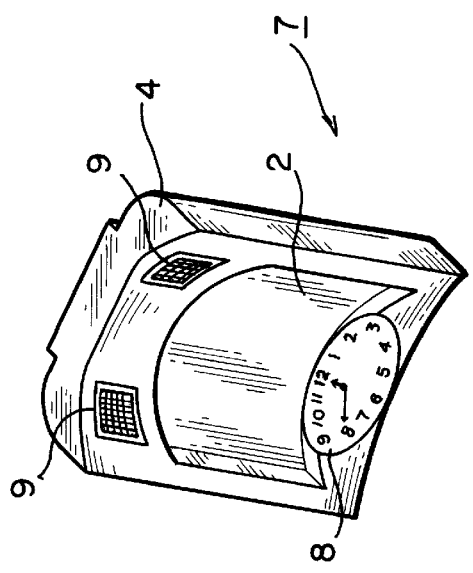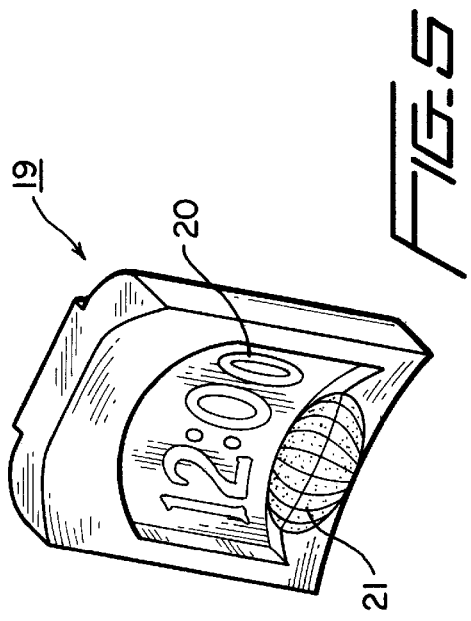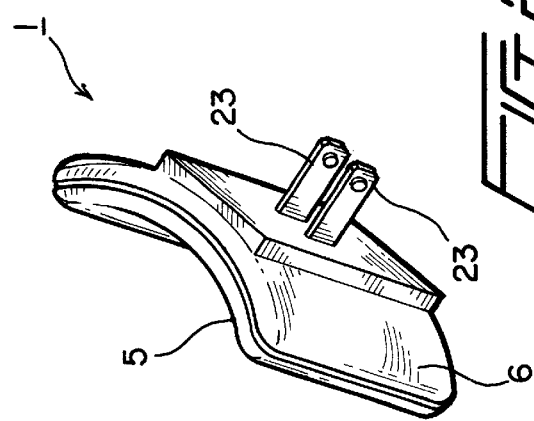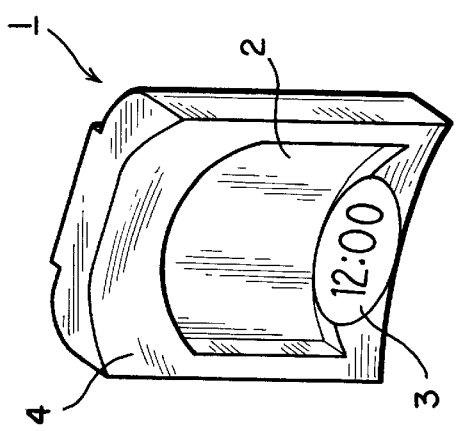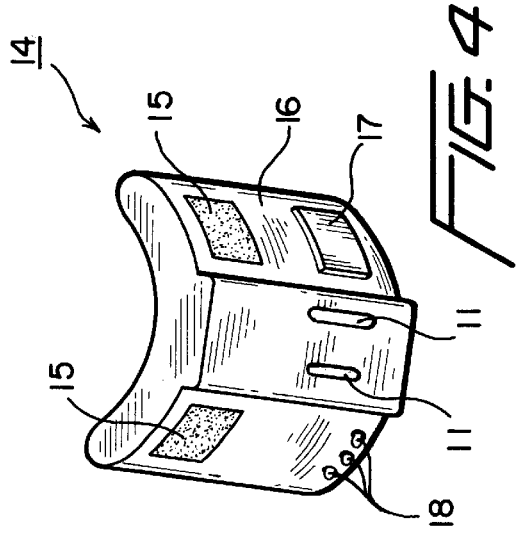

ELECTRO-LUMINESCENT NIGHT LIGHT AND TIME PIECE

This application is a continuation-in-part of U.S. patent application Ser. No. 08/910,202, filed Aug. 13, 1997, which is a continuation-in-part of U.S. patent application Ser. No. 08/383,404, filed Feb. 3, 1995, and now U.S. Pat. No. 5,667,394.

BACKGROUND OF THE INVENTION

1. Field of the Invention

This invention relates to a combination night light and time-piece, and in particular to a combination night light and time-piece in which the time piece is separable from the night light for repair or replacement, and which includes an electro-luminescent lighting element which serves both as a night light and to illuminate the display of the time piece. The invention also relates to a combination night light and time-piece which provides additional optical effects to make an attractive display item.

2. Discussion of Related Art

An electro-luminescent night light is disclosed in parent U.S. patent application Ser. No. 08/910,202, filed Aug. 13, 1997, which is a continuation-in-part of copending U.S. patent application Ser. No. 08/383,404, filed Feb. 3, 1995, now allowed. The present invention combines a night light arrangement preferably of the type disclosed in the parent application, but which may also be extended to include other prior electro-luminescent night light arrangements, with a time-piece.

The night light disclosed in the parent application, and of course other conventional electro-luminescent night lights, only provide nighttime illumination and serve no other function. Although it is known to use electro-luminescent elements to provide back-lighting for a clock display, the electro-luminescent lighting components only work with a DC power source, rather than an electrical outlet or other external AC or DC power source, and the components cannot be used when parts of the time-piece are out of order or damaged. In addition, the display effects of the conventional time-pieces with electro-luminescent lights are relatively limited. The present invention, in contrast, provides a night light and time piece illuminated by electro-luminescent elements, with all of the advantages of electro-luminescent lighting such as low power consumption, brightness, color choice, and the possibility of providing special display effects, and yet in which the time piece can be arranged to be removed from the night light unit for repair or replacement of either the timepiece or the lighting elements, and which enables both the time piece and the lighting components to be used separately when the other is out of order or damaged.

While the present invention does not concern the electro-luminescent elements per se, and can be applied to a variety of electro-luminescent night lights and electro-luminescent lighting elements, examples of electro-luminescent lighting elements which may be used with the night lights disclosed herein are the electro-luminescent panels having discrete phosphor coatings areas as disclosed in U.S. Pat. No. 5,572,817, and in copending U.S. patent application Ser. Nos. 08/729,408 (allowed), 08/734,872 (pending), and 08/746,706 (pending), each of which is incorporated by reference herein, as well as the three-dimensional electro-luminescent tube arrangement disclosed in U.S. patent application Ser. No. 08/758,393, which is also incorporated by reference herein. The night lights disclosed herein may also be used with the optical effects device disclosed in U.S. patent application Ser. No. 08/841,624 (pending), also incorporated herein by reference, which is a continuation of U.S. patent application Ser. No. 08/489,160 (abandoned).

The time-pieces with which the night lights of the invention are combined are also known per se, and in fact the ability to be combined with existing time-pieces without the need to make significant modifications to the time pieces is a significant advantage of the present invention. Such time pieces can include clocks with digital or analog displays, including displays of both the mechanical and electrical (LCD) type, as well as time pieces with additional functions such as displaying the date, providing a wake-up alarm, sleep timer, or snooze function, serving as a radio or music player, and any combination of the above or other functions, all in a convenient and attractive electro-luminescent night light.

SUMMARY OF THE INVENTION

It is accordingly an objective of the invention to provide a combination night light and time-piece.

It is a further objective of the invention to provide a combination night light and time-piece in which, according to one embodiment of the invention, the time piece has a separate power source from that of the night light for easy repair or replacement, and which includes an electro-luminescent lighting element which serves both as a night light and to illuminate the display of the time piece.

It is a still further objective of the invention to provide a time-piece illuminated by electro-luminescent lighting, with all the advantages of electro-luminescent lighting such as low power consumption, brightness, color choice, and the possibility of providing special effects, and yet in which the time piece can be arranged to be removed from the night light unit for repair or replacement of the time-piece components, and which enables both the time piece and the lighting components to be used separately when the other is out of order or damaged.

It is yet another objective of the invention to provide a combination night light and time piece which includes special display effects, including projection of the time piece display.

BRIEF DESCRIPTION OF THE DRAWINGS

FIG. 1 is a perspective view of a night light/time piece constructed in accordance with the principles of a first preferred embodiment of the invention.

FIG. 2 is a perspective view showing the rear of the night light/time piece of FIG. 1.

FIG. 3 is a perspective view of a night light/time piece constructed in accordance with the principles of a second preferred embodiment of the invention.

FIG. 4 is a perspective view of a variation of the preferred night light/time pieces illustrated in FIGS. 1–3.

FIG. 5 is a perspective view of a further variation of the preferred night light/time piece illustrated in FIG. 1.

DETAILED DESCRIPTION OF THE PREFERRED EMBODIMENTS

Figure 6:
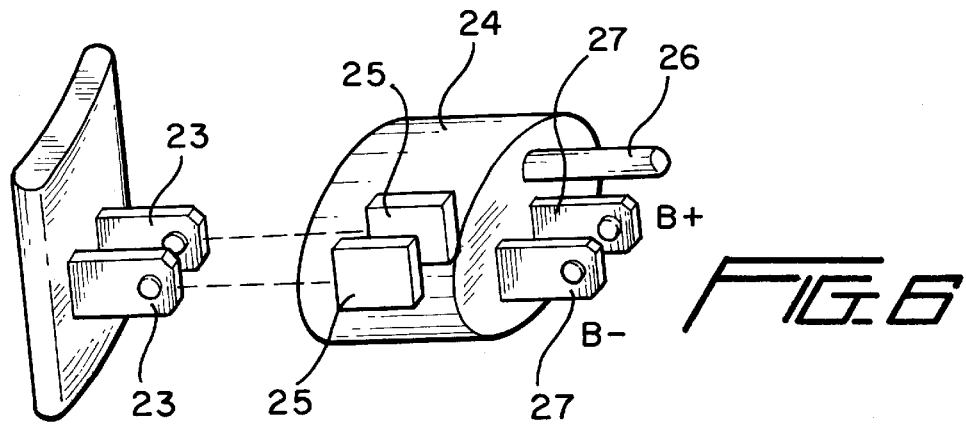
FIGS. 6–8 are perspective views of adapters suitable for use with the night light/time pieces of the preferred embodiments.

FIG. 1 shows a combined night light and time piece 1 constructed in accordance with the principles of a preferred embodiment of the invention. Night light/time piece 1 includes an electro-luminescent lighting element 2 and a time piece 3 arranged relative to the electro-luminescent element in a housing 4 such that the time piece 3 is illuminated by the electro-luminescent element 2. In order to better illuminate the time piece, housing 4 preferably has a concave shape with the face of the time piece 3 being oriented at a non-zero or oblique angle relative to the electro-luminescent lighting element 2.

The time piece 3 can be any suitably shaped time piece, including ones with multiple functions as mentioned above, and can even include its own back-lighting electro-luminescent element to make the messages in the time piece display appear to pop-out of the reading surface. Optionally, the time piece itself, or the portion of the housing to which the time piece is mounted as shown in FIG. 1, may be separable from the portion of the housing in which the electro-luminescent element is mounted so that the either the time piece or night light can be used separately if the other is damaged or needs to be replaced.

The electro-luminescent lighting element is connected by appropriate electrical connection means to a power source, which is also shared by the electrical device. As will be described below, the electrical connection means may include prongs 23, shown in FIG. 2, and various adapters described below in connection with 6–8. In addition, it will be appreciated that the electrical device may include inverter circuitry for causing the electro-luminescent element to emit light of a desired brightness and color, and optional circuitry for causing the lighting element to exhibit special effects, such as motion effects in the case where the lighting element includes multiple discrete phosphor areas in the manner described in copending application Ser. No. 08/746,706, cited above. Such effects can be further enhanced by connecting the lighting element to the electrical device, such that for example a timing or frequency at which the lighting element is triggered depends on an output of the electrical device so that the lighting effects are varied according to measured parameters including temperature, humidity, and so forth.

Suitable control circuits for the electro-luminescent element are disclosed in numerous prior patents, including but not limited to copending U.S. patent application Ser. No. 08/773,092, incorporated by reference herein, which discloses a circuit for controlling light emission by an electro-luminescent element based on an output of or input to an audio device.

In the case where the time piece has other features, it will be appreciated that those other features could include displaying the date, providing a wake-up alarm, sleep timer, or snooze function, serving as a radio or music player, or any combination of the above or other display, sound generating, or message conveying features. In addition, those skilled in the art will appreciate that the time piece could include additional devices such as sensors or detectors in addition to or in place of the illustrated sound generator or speaker.

Figure 7:
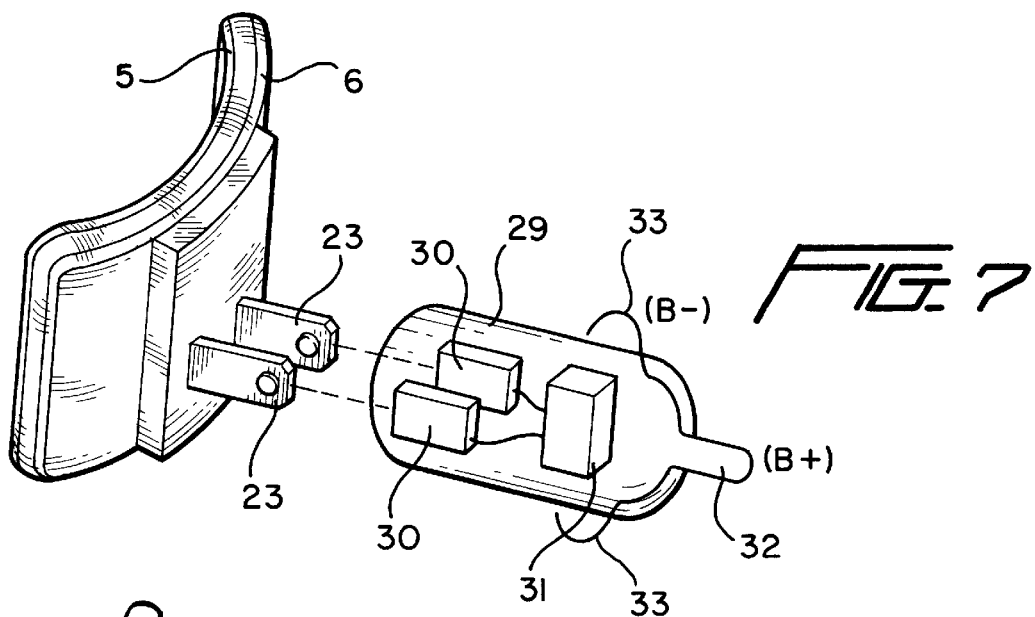
Figure 8:
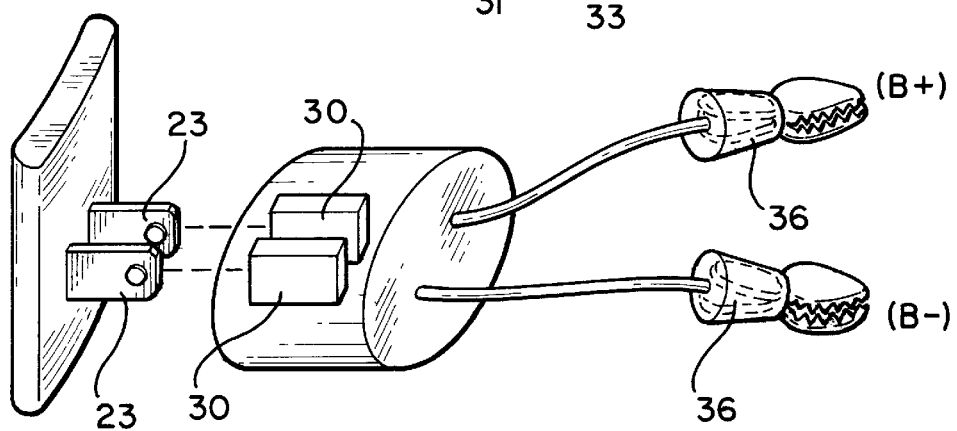

In order to facilitate assembly and/or separation of the time piece from the electro-luminescent element portion of the combined night light/time piece, the housing of the night light unit 1 may be made up of two parts, as shown in FIG. 2, including a front housing 5 and a rear housing 6. Extending from the rear of unit 1, as shown in FIG. 2, are prongs 23 of the plug which is to be inserted into a standard AC outlet, although it will be appreciated by those skilled in the art that the configuration of the prongs may be varied to fit different types of electrical outlets, including three prong outlets, outlets designed to meet the requirements of different countries, and outlets designed for power sources other than standard household power outlets, including power sources arranged to plug into vehicle and outdoor power adapters. Alternatively, the prong arrangement shown in FIG. 2 can be used with one of the adapters shown in FIGS. 6–8, including an adapter 24 having openings 25 for receiving prongs 23 and a ground prong 26 in addition to prongs 27, a vehicle DC outlet adapter 29 including prong-receiving openings 30, DC/AC converter 31, and contacts 32 and 33 for engaging corresponding contacts in a vehicle DC outlet or cigarette lighter receptacle, and adapter 34 including prong-receiving openings 35 and alligator clips 36 for attachment to a 6 or 12 volt dry cell-type power source.

Alternative to the arrangement shown in FIG. 1 is the night light/time piece 7 shown in FIG. 3, which can utilize the same electro-luminescent element 2 and housing 4 as in the embodiment of FIG. 1, and in which the time piece 8 is arranged to provide a message or alarm function via speakers, sound generators, or other means 9 for communicating with a person. While time piece 8 illustrated in FIG. 3 is analog and time piece 3 illustrated in FIG. 1 is an LCD time piece, it will be appreciated by those skilled in the art that either of time pieces 3 or 8 may be replaced by any suitable analog or digital, electronic or mechanical display, or any combination of such displays.

A variation of the night light units illustrated in FIGS. 1–3 is the night light unit 14 shown in FIG. 4, in which the speakers, sound generators, or other adjustable or communicating means 15 are placed at the rear of the housing 16. Also shown in FIG. 4 are openings 11 for the prongs of a plug, if the unit is to be connected to an electrical outlet, an opening 17 for receiving a battery or facilitating replacement of other components within the housing, and knobs or buttons 18 for controlling functions of the unit such as setting the time.

In the night light unit 19 shown in FIG. 5, the integral time piece display of FIGS. 1 and 3 is replaced by an image 20 projected onto the electro-luminescent panel 21 by means of a projection device 21. The projection device 21 can use a variety of image projecting means, such as reflection, "heads up display" techniques, projecting lenses, gratings, or prisms, or combinations of such techniques to project an a display image onto the panel 21. Alternatively, a variety of optical effects could be exploited to direct the image directly to the viewer or to another surface, such as the ceiling of a bedroom above a person's bed, using transparent members made of materials such as acrylic, polycarbonate, PS, PVC, and so forth, and the combined night light/time piece could also use an LCD panel with a module to create the same effects utlizing the same power source as the electro-luminescent element.

Figure 9:
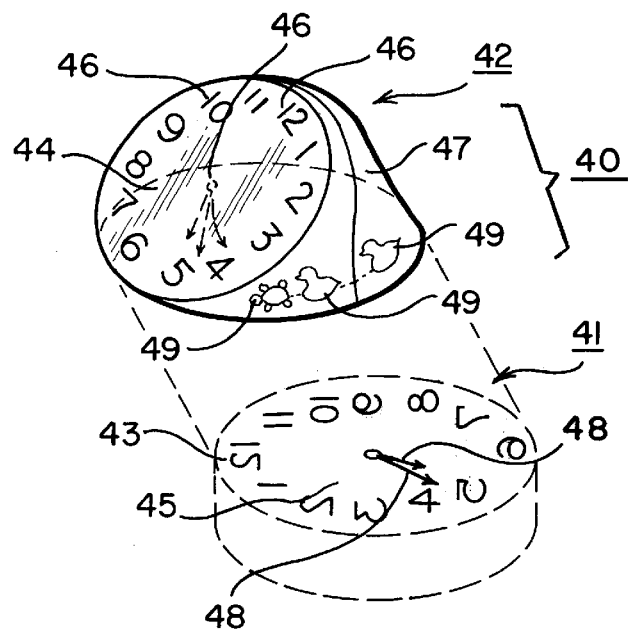
FIG. 9 is an exploded perspective view of a portion of a night light/time piece constructed in accordance with the principles of a further preferred embodiment of the invention.
Figure 10:
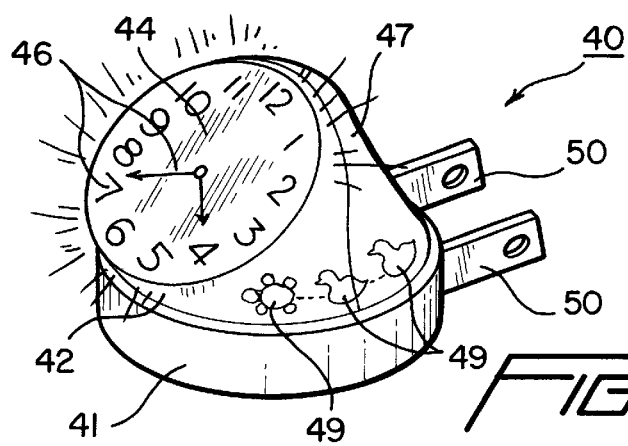
FIG. 10 is a perspective view of an assembled version of the night light/time piece whose principles are illustrated in FIG. 9.

The combined night light/time piece 40 of FIGS. 9 and 10 utilizes the optical effects principle of FIG. 5 by adding to the combined night light/time piece 41 an optical effects device 42 with projects an image of the time piece display 43 onto a front surface 44 by the optical effects device.

In this embodiment, the night light/time piece includes an electro-luminescent panel 45 on a front surface, and an mechanical display 46 on the same surface, the mechanical display being back-lit by the electro-luminescent panel and an image of the display being projected through a transmissive medium in the optical effects device 42, which can be either solid or liquid.

In the case of a liquid transmissive medium 47, arms 48 of the mechanical display can be magnetized, or include magnets, and magnetic elements 49 can be mounted in the liquid in known fashion to move in response to movement of arms 48. The magnetic elements can be shaped in any attractive fashion, for example as ducks, turtles, fish, or the like to provide not only a combination night light/time piece, but also an aquarium or water-ball which glows to provide additional nighttime fun.

Figure 11:
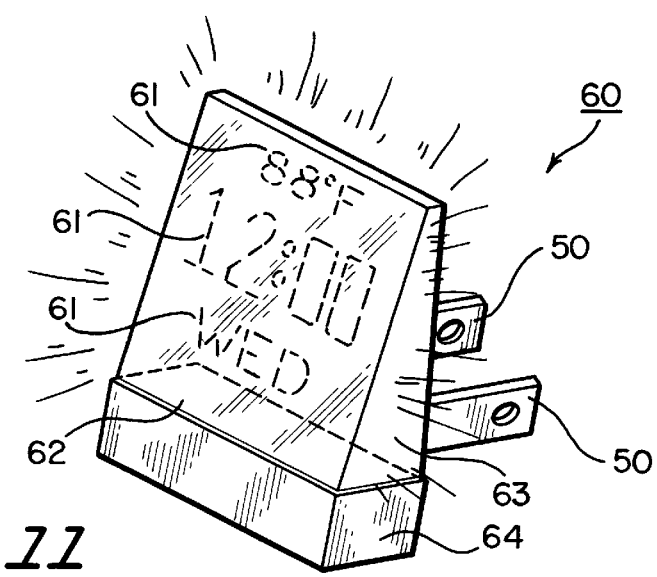
FIG. 11 is a perspective view of a variation of the night light/time-piece illustrated in FIGS. 9 and 10.

Finally, FIG. 11 shows a projection arrangement for a night light/time piece 60 similar to that of FIGS. 9 and 10, but in which the image 61 projected onto a surface 62 of a prism-shaped optical effects member 63 is of a digital (LCD) dieplay contained in the night light/time piece base unit 64, the digital display including a display of day and termperature in addition to the time, and the optical effects member not including any movable magnetic members. It will of course be appreciated that the base unit 64 could provide display in addition to or in place of the day/temperature display.

Having thus described several preferred embodiments of the invention and a number of different variations and modifications of the preferred embodiments, it is anticipated that still further variations and modifications will undoubtedly occur to those skilled in the art upon reading the above description, and it is therefore intended that the invention be interpreted solely in accordance with the appended claims.

I claim:

1. In a night light, comprising:
   at least one electro-luminescent element;
   means including at least two conductive prongs for electrically connecting said at least one electro-luminescent element to a power source; and
   a housing in which said electro-luminescent element and said electrical connection means are situated,
   the improvement wherein a time piece having a power source separate from the power source for the electro-luminescent elements is mounted in said housing, said time piece having a display illuminated by the electro-luminescent element.

2. A night light as claimed in claim 1, wherein said time piece further includes its own electro-luminescent elements for back-lighting the display.

3. A night light as claimed in claim 1, wherein said time piece further provides functions in addition to displaying a time.

4. A night light as claimed in claim 1, wherein said time piece is separable from said night light.

5. A night light as claimed in claim 1, further comprising an optical effects device for enhancing said image of the display using a process selected from the group consisting of diffracting, reflecting, englarging, or projecting.

6. A night light as claimed in claim 1, further comprising means controlled by said time piece for communicating with a person.

7. A night light as claimed in claim 1, wherein said housing has a concave surface to facilitate illumination of said display by said time piece.

8. A night light as claimed in claim 1, further comprising an adapter for enabling said prongs to be connected to other types of power supplies.

9. A night light as claimed in claim 1, wherein said electrical connection means includes inverter means for converting power from said power source into electrical signals capable of causing said electro-luminescent lighting element to emit light of a desired color and brightness.

10. A night light as claimed in claim 1, wherein the electro-luminescent element is mounted on a surface of the time piece.

11. A night light as claimed in claim 1, wherein multiple electro-luminescent elements are included.

12. In a night light, comprising:
    at least one electro-luminescent element;
    means including at least two conductive prongs for electrically connecting said at least one electro-luminescent element to a power source; and
    a housing in which said electro-luminescent element and said electrical connection means are situated,
    the improvement wherein a time piece having an LCD display is mounted in said housing, said LCD display being illuminated by the electro-luminescent element.

13. In a night light, comprising:
    at least one electro-luminescent element;
    means including at least two conductive prongs for electrically connecting said at least one electro-luminescent element to a power source; and
    a housing in which said electro-luminescent element and said electrical connection means are situated,
    the improvement wherein a time piece is mounted in said housing, and an optical effects device is included to project an image of a display of said time piece to a desired location.

14. A night light as claimed in claim 13, wherein said optical effects device is made from a solid material selected from the group consisting of acrylic, polycarbonate, PS, and PVC.

15. A night light as claimed in claim 13, wherein the optical effect device includes a hollow space filled with different densities of liquid material to focus the image on a desired location.

16. A night light as claimed in claim 15, wherein the display is a mechanical display in which at least one moveable arm of the display is magnetic and the liquid has situated therein magnetic members arranged to move in response to movement of the arm.

17. A night light as claimed in claim 16, wherein said magnetic members are arranged into at least two groups and arranged to follow different arms on the display.

* * * * *